(12) United States Patent
Lee et al.

(10) Patent No.: US 12,399,684 B2
(45) Date of Patent: Aug. 26, 2025

(54) LOW POWER ADDER TREE STRUCTURE

(71) Applicant: Taiwan Semiconductor Manufacturing Company, Ltd., Hsinchu (TW)

(72) Inventors: Chia-Fu Lee, Hsinchu (TW); Po-Hao Lee, Hsinchu (TW); Yi-Chun Shih, Taipei (TW); Yu-Der Chih, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 929 days.

(21) Appl. No.: 17/532,632

(22) Filed: Nov. 22, 2021

(65) Prior Publication Data
US 2022/0253282 A1    Aug. 11, 2022

Related U.S. Application Data

(60) Provisional application No. 63/148,414, filed on Feb. 11, 2021.

(51) Int. Cl.
*G06F 7/501*    (2006.01)
*G06F 7/506*    (2006.01)

(52) U.S. Cl.
CPC .............. *G06F 7/501* (2013.01); *G06F 7/506* (2013.01)

(58) Field of Classification Search
CPC ................................. G06F 7/501; G06F 7/506
See application file for complete search history.

(56) References Cited

U.S. PATENT DOCUMENTS

| 3,970,833 A | 7/1976 | Navy |
| 5,991,909 A | 11/1999 | Rajski et al. |

(Continued)

FOREIGN PATENT DOCUMENTS

| CN | 105512724 A | 4/2016 |
| CN | 107784136 A | 3/2018 |

(Continued)

OTHER PUBLICATIONS

Chip-Hong Chang, Jiangmin Gu and Mingyan Zhang, "A review of 0.18-/spl mu/m full adder performances for tree structured arithmetic circuits," in IEEE Transactions on Very Large Scale Integration (VLSI) Systems, vol. 13, No. 6, pp. 686-695, Jun. 2005. (Year: 2005).*

(Continued)

*Primary Examiner* — Andrew Caldwell
*Assistant Examiner* — Jonathan David Warner
(74) *Attorney, Agent, or Firm* — FOLEY & LARDNER LLP (57) ABSTRACT

In some aspects of the present disclosure, an adder tree circuit is disclosed. In some aspects, the adder tree circuit includes a plurality of full adders (FAs) including: a first subgroup of FAs, wherein each FA of the first subgroup includes a first number of transistors; and a second subgroup of FAs, wherein each FA of the second subgroup includes a second number of transistors, the first number being greater than the second number; wherein each FA of the first subgroup receives a first input from a first one of the second subgroup of FAs and a second input from a second one of the second subgroup of FAs, and each FA provides a first output to a third one of the second subgroup of FAs and a second output to a fourth one of the second subgroup of FAs.

20 Claims, 9 Drawing Sheets

(56) References Cited

U.S. PATENT DOCUMENTS

| | | | |
|---|---|---|---|
| 6,127,842 A | 10/2000 | Dalal et al. | |
| 2024/0403527 A1* | 12/2024 | Chen | G06F 30/3323 |

FOREIGN PATENT DOCUMENTS

| | | |
|---|---|---|
| CN | 112070219 A | 12/2020 |
| EP | 1 308 836 A1 | 5/2003 |
| JP | H651950 A | 2/1994 |
| KR | 19990011333 A | 2/1999 |
| KR | 20040092376 A | 11/2004 |
| KR | 20070030320 A | 3/2007 |
| KR | 20180043083 A | 4/2018 |
| TW | 200823908 A | 6/2008 |
| TW | 201137740 A | 11/2011 |
| TW | 202029208 A | 8/2020 |

OTHER PUBLICATIONS

Office Action issued in connection with Korean Appl. No. 10-2022-0006537 dated Feb. 23, 2024.
Office Action issued in connection with Taiwan Appl. No. 111103104 dated Mar. 10, 2025.

\* cited by examiner

LOW POWER ADDER TREE STRUCTURE

CROSS-REFERENCE TO RELATED APPLICATION

This application is related to and claims priority under 35 U.S. § 119(e) the U.S. Provisional Patent Application No. 63/148,414, filed Feb. 11, 2021, titled "NEW LOW POWER ADDER TREE STRUCTURE," the entire contents of which are incorporated herein by reference for all purposes.

BACKGROUND

A full adder is an adder which adds three inputs and produces two outputs. The first two inputs are two operands, A and B, and the third input is an input carry, Cin. The output carry is designated as Cout and the sum output is designated as S. A full adder can be used in binary arithmetic circuits, which perform addition, subtraction, multiplication, and division.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of an adder tree that provides full adders (FAs) of stronger driving/drive strength (e.g., 28-transistor (28T) adders) interleaved with FAs of weaker driving strength (e.g., 14-transistor (14T) adders). In some embodiments, each FA of a first subgroup of the FAs (e.g., 28T adders) receives a first input (e.g., a carry-in) from a first FA of a second subgroup of the FAs (e.g., 14T adders) and a second input (e.g., an operand) from a second FA of the second subgroup. In some embodiments, the FAs are arranged in rows and columns, the first FA of the second subgroup is in a same row as the FA of the first subgroup, and the second FA of the second subgroup is in a same column as the FA of the first subgroup. In some embodiments, each FA of the first subgroup provides a first output (e.g., a carry-out) to a third FA of the second subgroup and a second output (e.g., a sum) to a fourth FA of the second subgroup. In some embodiments, the third FA of the second subgroup is in a same row as the FA of the first subgroup, and the fourth FA of the second subgroup is in a same column as the FA of the first subgroup. The present disclosure further provides various embodiments of a novel 14T FA topology.

Advantageously, embodiments of the disclosed adder tree can achieve several benefits. In some embodiments, the disclosed adder tree with two types of FAs has a lower silicon (e.g., chip, transistor) area and a lower power consumption than an adder tree using only FAs of a stronger driving strength (e.g., 28-transistor FAs) while having a negligible impact on speed/driving strength. Moreover, speed can be optimized by how the two types of FAs are arranged.

Figure 1A:
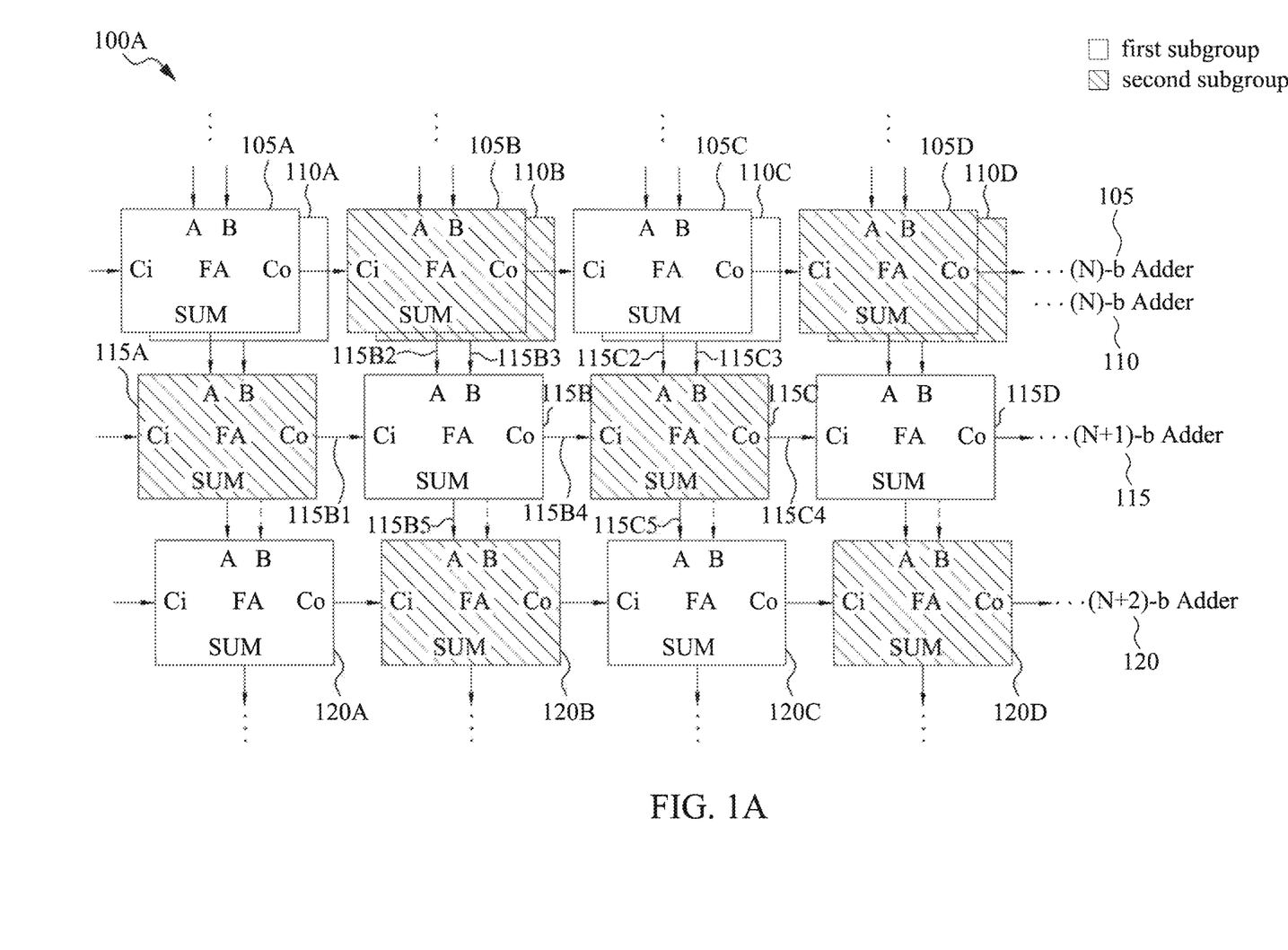
FIGS. 1A, 1B, 1C, and 1D each illustrates a block diagram of an adder tree, in accordance with some embodiments of the present disclosure.

FIG. 1A illustrates a block diagram of an adder tree 100A, in accordance with some embodiments of the present disclosure. The adder tree 100A includes a number of full adders (FAs). For example, as shown in FIG. 1A, the adder tree 100A includes FAs 105A, 105B, 105C, 105D, 110A, 110B, 110C, 110D, 115A, 115B, 115C, 115D, 120A, 120B, 120C, and 120D. Although 16 adders are shown, the adder tree 100 can include any number of FAs while remaining in the scope of the disclosure.

The FAs of the adder tree 100A can be arranged in rows and columns. For example, a first row can include the FAs 105A-105D, a second row can include the FAs 110A-110D, a third row can include the FAs 115A-115D, and a fourth row can include the FAs 120A-120D. Although each row is shown to include 4 FAs, each row can include any number of FAs while remaining in the scope of the disclosure. Moreover, one row can include a different number of FAs than does another row. For example, the first and second rows can include N FAs, the third row can include N+1 FAs, and the fourth row can include N+2 FAs, wherein N is an integer value. In some embodiments, a first column can include 105A, 110A, 115A, and 120A, a second column can include 105B, 110B, 115B, and 120B, a third column can include 105C, 110C, 115C, and 120C, and a fourth column can include 105D, 110D, 115D, and 120D. Although each column is shown to include 4 FAs, each column can include any number of FAs while remaining in the scope of the disclosure.

In some embodiments, two or more of the rows can be different/stacked layers/levels of a same row. A row including multiple layers can denoted herein as a "row*." For example, the first row including 105A-105D and the second row including 110A-110D can be different layers of a same row*. In some embodiments, different layers of a same row* (e.g., FAs 105A-105D and 110A-110D) couple to and provide signals to another row* of FAs (e.g., FAs 115A-115D). For example, FA 105A and FA 110A are different layers of a same row*, and FA 105A and FA 110A provide signals to FA 115, which is in another row*. Although only two layers are shown in the first row*, one layer is shown in the second row*, and one layer is shown in the third row*, any number of layers can exist for each of the rows* without departing from the scope of the present disclosure. For example, the first row* can have four layers, the second row* can have two layers, and the third row* can have one layer.

The FAs of the adder tree 100A can be classified by two subgroups (portions, segments, categories, types, subtypes, pluralities, etc.) In some embodiments, each FA of a first subgroup of the FAs (e.g., the FAs 105A, 105C, 110A, 110C, 115B, 115D, 120A, and 120C) of the adder tree 100A includes a first number of transistors. For example each FA of the first group of the FAs includes 28 transistors. As shown in FIG. 1A, the first subgroup classification can be denoted by a pattern-less fill of the corresponding block. In some embodiments, each FA of a second subgroup of the FAs (e.g., the FAs 105B, 105D, 110B, 110D, 115A, 115C, 120B, and 120D) of the adder tree 100A includes a second number of transistors. For example, the second group of the FAs includes 14 transistors. In some embodiments, each FA of the second subgroup of the FAs of the adder tree 100A consists of the second number of transistors. As shown in FIG. 1A, the second subgroup classification can be denoted by a dot patterned fill of the corresponding block. In some embodiments, the first number of transistors can include any number, for example, including 28, 20, 18, 16, 14, or 10, and the second number of transistors can include any number, for example, including 28, 20, 18, 16, 14, or 10. Any of other first and second number of transistors are within the scope of the disclosure. In some embodiments, the first number of transistors is greater than the second number of transistors. In some embodiments, each of the FAs of the first subgroup has a first driving strength (e.g., a first speed in charging or discharging a capacitor coupled to an output of the FA, a first output conductance), a first power consumption, and a first device area that is greater than a second driving strength (e.g., a second speed, a second output conductance), a second power consumption, and a second device area, respectively, of each of the FAs of the second subgroup.

In some embodiments, the FAs are arranged such that the FAs of the second subgroup are disposed (e.g., inserted, placed, interleaved) between FAs of the first subgroup. For example, the FA 105B is disposed between the FA 105A and the FA 105C. In some embodiments, each FA (e.g., a first FA, each FA that is receiving inputs from two FAs and providing outputs to two FAs) of the first subgroup receives a first input (e.g., a carry-in) from a first FA of the second subgroup, receives a second input (e.g., an operand) from a second FA of the second subgroup, provides a first output (e.g., a carry-out) to a third FA of the second subgroup, and provides a second output (e.g., a sum) to a fourth FA of the second subgroup. For example, the FA 115B receives a carry-in through the line 115B1 from the FA 115A and a first operand through the line 115B2 from the FA 105B, and the FA 115B provides a carry-out through the line 115B4 to the FA 115C and a sum through the line 115B5 to the FA 120B. In some embodiments, each FA of the first subgroup receives a third input from a fifth FA of the second subgroup. For example, the FA 115B receives a second operand through the line 115B3 from the FA 110B.

In some embodiments, each FA of the second subgroup receives a first input from a first FA of the first subgroup, receives a second input from a second FA of the first subgroup, provides a first output to a third FA of the first subgroup, and provides a second output to a fourth FA of the first subgroup. For example, the FA 115C receives a carry-in through the line 115B4 from the FA 115B and an operand through the line 115C2 from the FA 105C, and the FA 115C provides a carry-out through the line 115C4 to the FA 115D and a sum through the line 115C5 to the FA 120C.

In some embodiments, each adjacent pair of FAs are coupled via a line (e.g., a wire, a conductor, a connector, etc.). For example, the line 115B1 couples the FA 115A to the FA 115B, the line 115B2 couples the FA 105B to the FA 115B, the line 115B3 couples the FA 110B to the FA 115B, the line 115B4 couples the FA 115B to the FA 115C, and the line 115B5 couples the FA 115B to the FA 120B. Additionally, in some embodiments, the line 115C2 couples the FA 105C to the FA 115C, the line 115C3 couples the FA 110C to the FA 115C, the line 115C4 couples the FA 115C to the FA 115D, and the line 115C5 couples the FA 115C to the FA 120C. In some embodiments, each of the lines couples an FA of the first subgroup to an FA of the second subgroup.

In some embodiments, the signals are provided to or received from FAs in adjacent rows* or columns. In some embodiments, each signal represents a bit. In some embodiments, a carry-in (Ci) signal is received by a first FA from a second FA in an adjacent column (e.g., to the left), a first input (A) signal is received by the first FA from a third FA in an adjacent row* (e.g., above), a second input (B) signal is received by the first FA from a fourth FA in an adjacent row* (e.g., above), a carry-out (Co) signal is provided by the first FA to a fifth FA in an adjacent column (e.g., to the right), and a sum signal is provided by the first FA to a sixth FA in an adjacent row* (e.g., below).

The FA can determine (e.g., process, produce, generate) the sum and Co based on A (e.g., a first operand), B (e.g., a second operand), and Ci. For example, the FA determines the sum signal as a sum of the A signal and B signal. The following truth table shows a mapping of A, B, and Ci to outputs sum and Co.

| INPUT | | | OUTPUT | |
| --- | --- | --- | --- | --- |
| A | B | $C_I$ | Sum | $C_O$ |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

In some embodiments, signals are provided or received via respective lines. For example, the line 115B1 provides Ci to 115B, the line 115B2 provides the A signal to 115B, the line 115B3 provides the B signal to 115B, the line 115B4 provides the Co signal from 115B, and the line 115B5 provides the sum signal from 115B.

Each FA can include a number of ports (e.g., terminals, electrodes) for providing or receiving the signals. In some embodiments, each FA includes a port to receive the Ci signal, an A port to receive the A signal, a B port to receive the B signal, a carry-out (Co) port to provide the Co signal, and a sum port to provide the sum signal.

Pairs of adjacent FAs in a same row (e.g., in a same layer of a same row*) can be coupled between their respective Ci and Co ports. For example, the line 115B1 couples the Co port of the FA 115A to the Ci port of the 115B. Likewise, the Co port of 115B can be coupled to the Ci port of 115C, and the Co port of 115C can be coupled to the Ci port of 115D.

Pairs of adjacent FAs in a same column can be coupled between their respective A and sum ports or B and sum ports. For example, the line 115B2 couples the sum port of the FA 105B to the A port of the 115B. Likewise, the sum port of 110B can be coupled to the B port of 115B and the sum port of 115B can be coupled to the A port of 120B.

In some embodiments, the adder is arranged as a number of multi-bit FAs. For example, a multi-bit FA 105 can include FAs 105A-105D, a multi-bit FA 110 can include FAs 110A-110D, a multi-bit FA 115 can include FAs 115A-115D, and a multi-bit FA 120 can include FAs 120A-120D. Each multi-bit FA can be arranged along a respective row (e.g., a respective layer of a respective row*). In some embodiments, each FA represents one bit of the multi-bit FA. For example, in the multi-bit FA 115, the FA 115A can represent a first bit, the FA 115B can represent a second bit, the FA 115C can represent a third bit, and the FA 115D can represent a fourth bit. In some embodiments, a carry bit propagates through the FAs of a multi-bit FA via the Ci and Co ports.

In some embodiments, a first multi-bit FA receives operands from second multi-bit FAs. For example, the multi-bit FA 115 receives a first number of operand bits from the multiple-bit FA 105. For example, the FA 115A receives a first operand bit from the FA 105A, the FA 115B receives a second operand bit from the FA 105B, the FA 115C receives a third operand bit from the FA 105C, and the FA 115D receives a fourth operand bit from the FA 105D. Additionally, in some embodiments, the multi-bit FA 115 receives a second number of operand bits from the multiple-bit FA 110. For example, the FA 115A receives a fifth operand bit from the FA 110A, the FA 115B receives a sixth operand bit from the FA 110B, the FA 115C receives a seventh operand bit from the FA 110C, and the FA 115D receives an eighth operand bit from the FA 110D.

In some embodiments, the multi-bit FA receiving the first number of operand bits and the second number of operand bits is a larger multi-bit FA than the multi-bit FA providing the first number of operand bits and the multi-bit FA providing the second number of operand bits. For example, the multi-bit FA 105 is an N-bit FA, the multi-bit FA 110 is an N-bit FA, and the multi-bit FA 115 is an N+1-bit FA. In some embodiments, another FA of the multi-bit FA 115 receives a first carry-in bit from the FA 105D and receives a second carry-in bit from the FA 110D.

In some embodiments, the first multi-bit FA sums operands received from the second multi-bit FAs. For example, the multi-bit FA 115 sums the first number of operand bits received from the multi-bit FA 105 and the second number of operand bits received from the multi-bit FA 110 to generate a number of sum bits. For example, the FA 115A sums the first operand bit from the FA 105A and the fifth operand bit from the FA 110A to generate a first sum bit, the FA 115B sums the second operand bit from the FA 105B and the sixth operand bit from the FA 110B to generate a second sum bit, the FA 115C sums the third operand bit from the FA 105C and the seventh operand bit from the FA 110C to generate a third sum bit, and the FA 115D sums the fourth operand bit from the FA 105D and the eighth operand bit from the FA 110D to generate a fourth sum bit. In some embodiments, the other FA of the multi-bit FA 115 sums the first carry-in bit received from the FA 105D and the second carry-in bit received from the FA 110D.

In some embodiments, the first multi-bit FA provides the sum to a third multi-bit FA. For example, the multi-bit FA 115 provides the number of sum bits to the multi-bit FA 120. For example, the FA 115A provides the first sum bit to the FA 120A, the FA 115B provides the second sum bit to the FA 120B, the FA 115C provides the third sum bit to the FA 120C, and the FA 115D provides the fourth sum bit to the FA 120D. In some embodiments, the multi-bit FA receiving the number of sum bits is a larger multi-bit FA than the multi-bit FA providing the number of sum bits. For example, the multi-bit FA 115 is an N-bit FA and the multi-bit FA 120 is an N+1-bit FA. In some embodiments, the FA 115D provides a carry-out bit to another FA of the multi-bit FA 120.

Figure 1B:
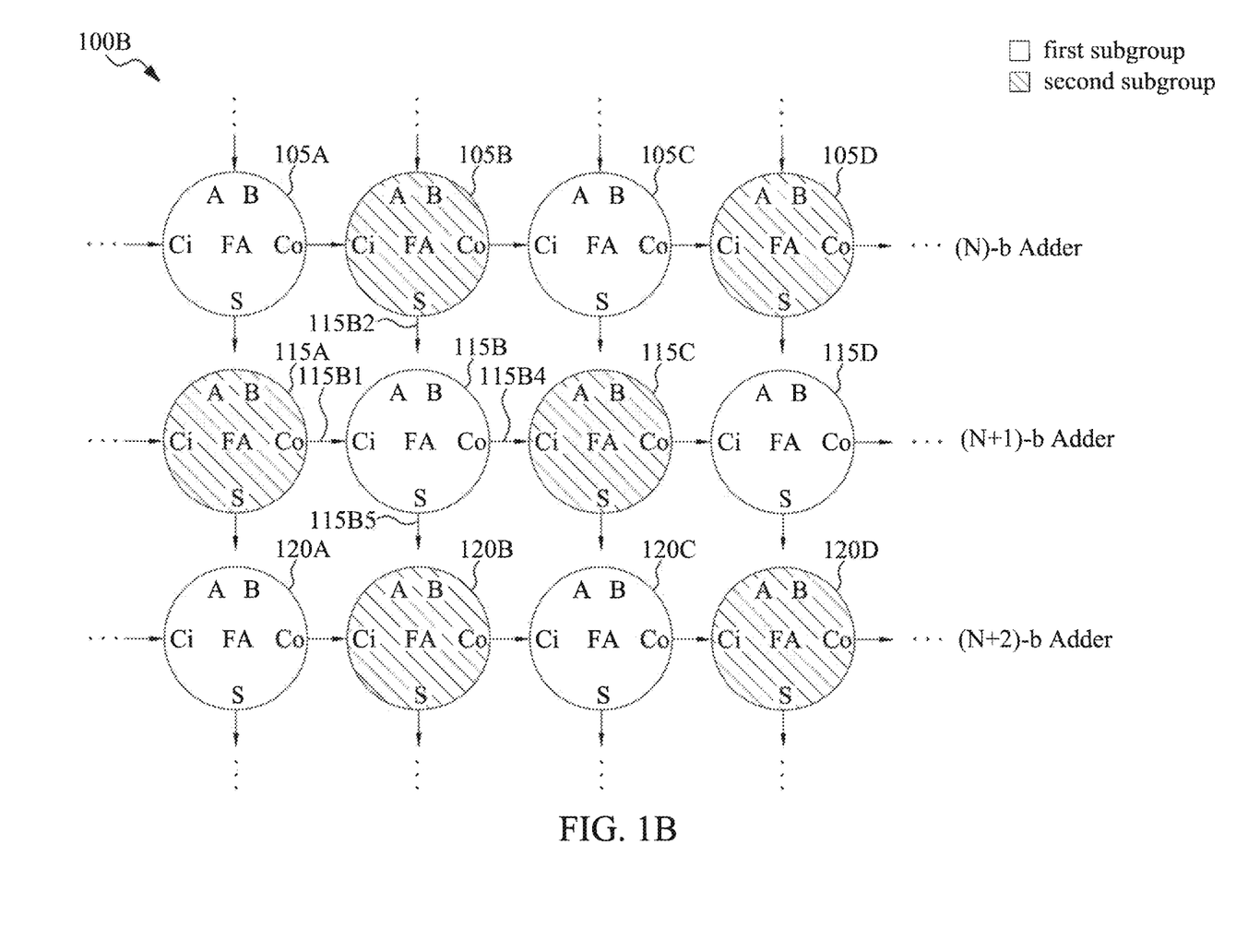

FIG. 1B illustrates a block diagram of an adder tree 100B, in accordance with some embodiments of the present disclosure. In some embodiments, adder tree 100B is a simplified view of adder tree 100A. For example, the adder tree 100B omits the FAs 110A-110D and omits the lines (e.g., 115B3) that provide a second operand to a B port of an FA. However, it is understood that such FAs and lines are within the scope of the disclosure and are omitted for sake of brevity.

In some embodiments, the FAs are arranged in a pattern/order of one or more Cs, one or more Ds, wherein the pattern is repeated, wherein C is an FA of the first subgroup having more transistors and D is an FA of the second subgroup having less transistors. In some embodiments, such as the embodiment in FIG. 1B, the FAs are arranged in a pattern/order of C-D-C-D-etc. In some embodiments, the pattern can be arranged in a row. For example, in FIG. 1B, FA 105A is a C, which is coupled to FA 105B, which is a D, which is coupled to FA 105C, which is a C, which is coupled to FA 105D, which is a D. In some embodiments, the pattern can be arranged in a column. For example, FA 105A (C) is coupled to FA 115A (D), which is coupled to FA 120A (C).

Figure 1C:
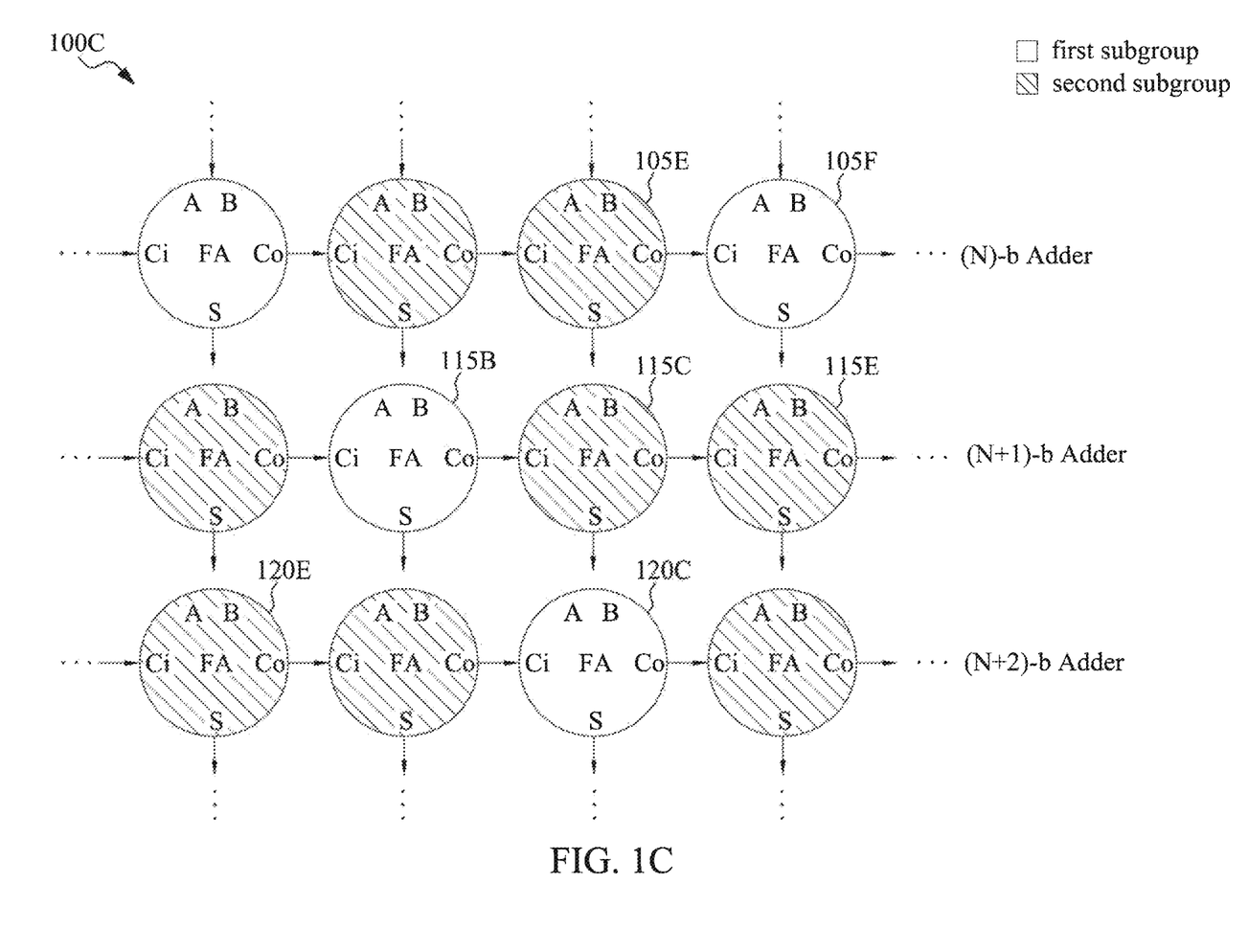

FIG. 1C illustrates a block diagram of an adder tree 100C, in accordance with some embodiments of the present disclosure. In some embodiments, adder tree 100C is similar to the adder tree 100B except that the FAs are arranged in a pattern/order of C-D-D-C-D-D-etc. For example, in FIG. 1C, FA 105A (C) is coupled to FA 105B (D), which coupled to FA 105E (D), which coupled to FA 105F (C). In some embodiments, FA 105E (D) replaces FA 105C (C) of FIG. 1B, FA 105F (C) replaces FA 105D (D) of FIG. 1B, FA 115E (D) replaces FA 115D (C) of FIG. 1B, and FA 120E (D) replaces FA 120A (C) of FIG. 1B.

In some embodiments, each FA (e.g., a first FA) of the second subgroup receives a first input from a first FA of the first subgroup, receives a second input from a second FA of the second subgroup, provides a first output to a third FA of the second subgroup, and provides a second output to a second FA of the first subgroup. For example, the FA 115C receives a carry-in through the line 115B4 from the FA 115B and an operand through the line 115C2 from the FA 105E of FIG. 1C, and the FA 115C provides a carry-out through the line 115C4 to the FA 115E of FIG. 1C and a sum through the line 115C5 to the FA 120C.

Figure 1D:
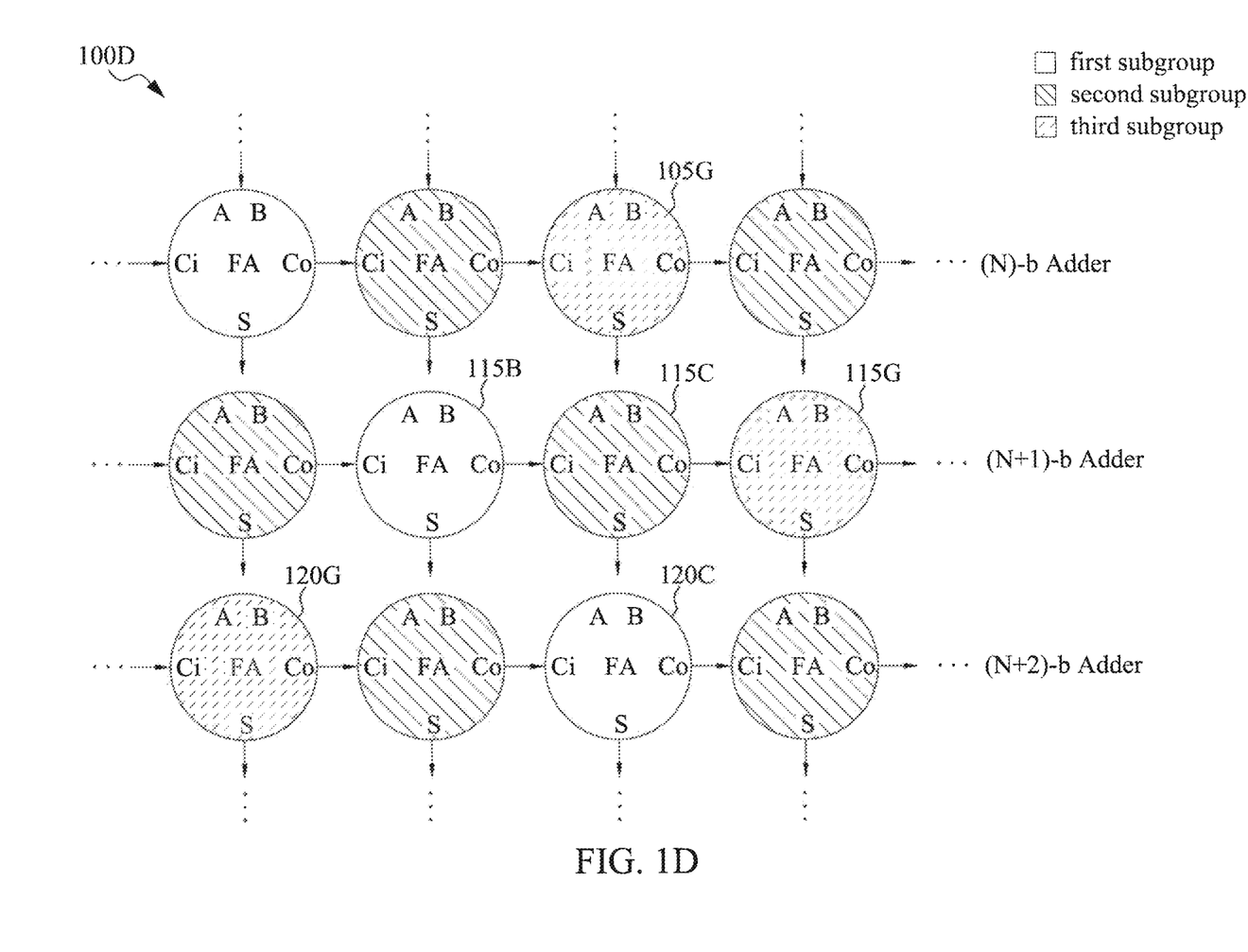

FIG. 1D illustrates a block diagram of an adder tree 100D, in accordance with some embodiments of the present disclosure. In some embodiments, adder tree 100D is similar to the adder tree 100B except that the FAs of the adder tree 100D can be classified by three subgroups. In some embodiments, the FAs are arranged in a pattern/order of C-D-E-D-C-D-E-D-etc., wherein E is an FA of the third subgroup having less transistors than that of D. For example, in FIG. 1D, FA 105A (C) is coupled to FA 105B (D), which coupled to FA 105G (E), which coupled to FA 105D (D). In some embodiments, FA 105G (E) replaces FA 105C (C) of FIG. 1B, FA 115G (E) replaces FA 115D (C) of FIG. 1B, and FA 120G (E) replaces FA 120A (C) of FIG. 1B.

In some embodiments, each FA (e.g., a first FA) of the second subgroup receives a first input from a first FA of the first subgroup, receives a second input from a first FA of the third subgroup, provides a first output to a second FA of the third subgroup, and provides a second output to a second FA of the first subgroup. For example, the FA 115C receives a carry-in through the line 115B4 from the FA 115B and an operand through the line 115C2 from the FA 105G of FIG. 1D, and the FA 115C provides a carry-out through the line 115C4 to the FA 115G of FIG. 1D and a sum through the line 115C5 to the FA 120C.

While the aforementioned FA arrangements have been described, any of various patterns of FAs are within the scope of the disclosure. In some embodiments, the pattern includes one or more Cs, one or more Ds, wherein the pattern is repeated. For example, the FAs can be arranged in a pattern of C-C-D-C-C-D-etc. In some embodiments, the pattern includes one or more Cs, one or more Ds, and one or more Es, wherein the pattern is repeated. In some embodiments, the pattern includes three or more subgroups.

Figure 2:
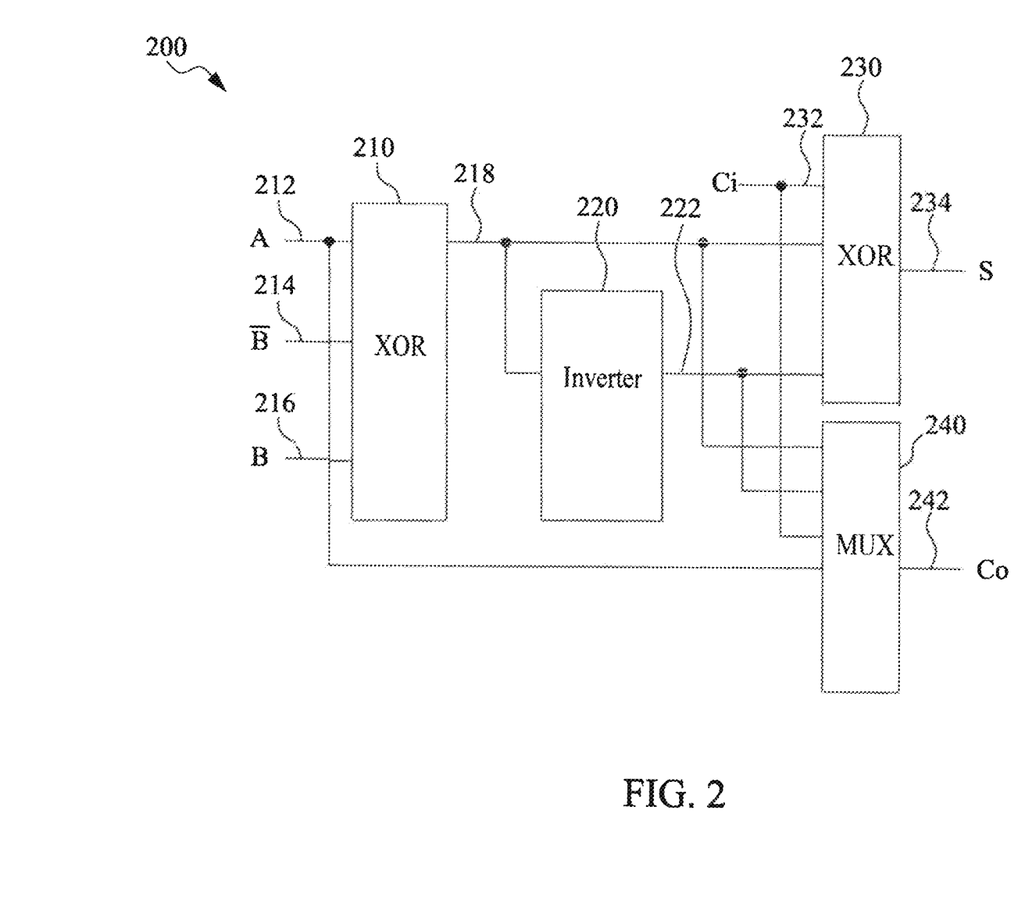
FIG. 2 illustrates a block diagram of a full adder, in accordance with some embodiments of the present disclosure.

FIG. 2 illustrates a block diagram of an FA 200, in accordance with some embodiments of the present disclosure. In some embodiments, the FA 200 is an implementation of any of the FAs of the second subgroup of FIG. 1A (e.g., any of the FAs 105B, 105D, 110B, 110D, 115A, 115C, 120B, and 120D of FIG. 1A). The FA 200 includes a stage 210. In some embodiments, the stage 210 is configured to receive a first input (A) signal, a second input (B) signal, and, in some embodiments, a third input signal ($\overline{B}$), and provide a first output signal. In some embodiments, the stage 210 can be modeled as an exclusive-OR (XOR) gate, e.g., with the A signal, the B signal, and the $\overline{B}$ signal as inputs and the first output signal as the output. The A signal can be provided via the line 212, the $\overline{B}$ signal can be provided via the line 214, the B signal can be provided via the line 216, and the first output signal can be provided via the line 218. The $\overline{B}$ signal may be an inverted instance of the B signal. The signals, A, B, and $\overline{B}$ may be provided, via the respective lines, by another one or more FAs, a global buffer, or any of other various components while remaining within the scope of the disclosure.

The FA 200 includes a stage 220 coupled to the stage 210 via the line 218. In some embodiments, the stage 220 is configured to receive the first output signal and provide a second output signal by inverting the first output signal. In some embodiments, the stage 220 can be modeled as an inverter, e.g., with the first output signal as the input and the second output signal as the output. The second output signal can be provided via the line 222.

The FA 200 includes a stage 230 coupled to the stage 210 via the line 218 and the stage 220 via the line 222. In some embodiments, the stage 230 is configured to receive a carry-in (Ci) signal, the first output signal, and the second output signal and provide a sum (S) signal. In some embodiments, the stage 230 can be modeled as an XOR gate, e.g., with the Ci signal, the first output signal, and the second output signal as inputs and the S signal as the output. In some embodiments, the Ci signal is provided via the line 232 and the S signal is provided via the line 234.

The FA 200 includes a stage 240 coupled to the stage 210 via the lines 212 and 218, the stage 220 via the line 222, and the stage 230 via the line 232. In some embodiments, the stage 240 is configured to receive the Ci signal, the first output signal, the second output signal, and the A signal, and provide a carry-out (Co) signal. In some embodiments, the stage 240 can be modeled as a multiplexer, e.g., with the A signal as the first input, the Ci signal as the second input, the first output signal as a control, the second output signal as an inverse of the control, and the Co signal as the output. In some embodiments, the Co signal is provided via the line 242.

Figure 3:
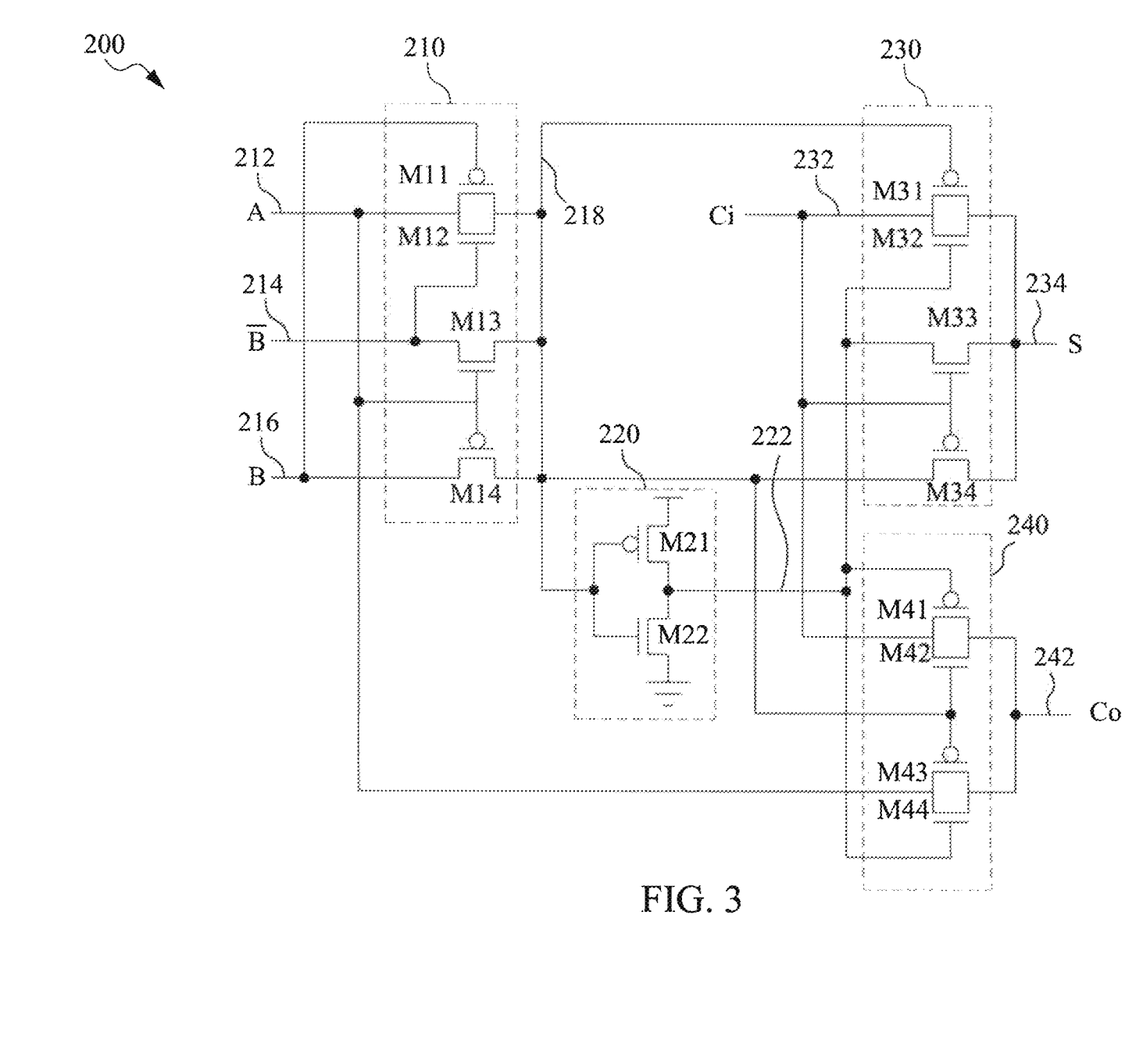
FIG. 3 illustrates a circuit diagram of a full adder, in accordance with some embodiments of the present disclosure.

FIG. 3 illustrates a circuit diagram of the FA 200, in accordance with some embodiments of the present disclosure. In some embodiments, the FA 200 includes 14 transistors. The 14 transistors can be disposed among the four stages, as described below.

In some embodiments, the stage 210 includes transistors M11, M12, M13, and M14, although stage 210 can include any of various number of transistors without departing from the scope of the disclosure. The transistors M11 and M12 can be a complementary (e.g., complementary metal-oxide-silicon, or CMOS) transmission gate (e.g., pass gate). In some embodiments, M11 is a p-type MOS (PMOS) transistor and M12 is an n-type MOS (NMOS) transistor although M11 and M12 can be any of various types of transistors without departing from the scope of the disclosure. In some embodiments, a gate, source, and drain of M11 is coupled to lines 216, 212, and 218, respectively. In some embodiments, a gate, source, and drain of M12 is coupled to lines 214, 212, and 218, respectively.

In some embodiments, in response to receiving a first signal (e.g., bit, state, voltage level, etc.) from line 216, M11 electrically couples line 212 to line 218. In some embodiments, in response to receiving a second signal from line 216, M11 electrically decouples line 212 from line 218. In some embodiments, in response to receiving a first signal from line 214, M12 electrically couples line 212 to line 218. In some embodiments, in response to receiving a second signal from line 214, M12 electrically decouples line 212 from line 218.

The transistors M13 and M14 can be a complementary (e.g., CMOS) pair of transistors having their gates shorted to each other. In some embodiments, the transistor M13 is an NMOS transistor and M14 is a PMOS transistor, although M13 and M14 can be any of various types of transistors without departing from the scope of the disclosure. In some embodiments, a gate, source, and drain of M13 is coupled to lines 212, 214, and 218, respectively. In some embodiments, a gate, source, and drain of M14 is coupled to lines 212, 216, and 218, respectively.

In some embodiments, in response to receiving a first signal from line 212, M13 electrically couples line 214 to line 218. In some embodiments, in response to receiving a second signal from line 212, M13 electrically decouples line 214 from line 218. In some embodiments, in response to receiving a first signal from line 212, M14 electrically couples line 216 to line 218. In some embodiments, in response to receiving a second signal from line 212, M14 electrically decouples line 216 from line 218.

In some embodiments, the stage 220 includes transistors M21 and M22, although stage 220 can include any of various number of transistors without departing from the scope of the disclosure. In some embodiments, the transistor M21 is a PMOS transistor and M22 is an NMOS transistor, although M21 and M22 can be any of various types of transistors without departing from the scope of the disclosure. In some embodiments, a gate, source, and drain of M21 is coupled to lines 218, a first reference line (e.g., VDD line providing a VDD signal), and line 222, respectively. In some embodiments, a gate, source, and drain of M22 is coupled to lines 218, a second reference line (e.g., ground line providing a ground signal), and line 222, respectively. In some embodiments, in response to receiving a first signal from line 218, M21 electrically couples line 222 to the first reference line and M22 electrically decouples line 222 from the second reference line. In some embodiments, in response to receiving a second signal from line 218, M22 electrically couples line 214 to the second reference line and M21 electrically decouples line 214 from the first reference line.

In some embodiments, the stage 230 includes transistors M31, M32, M33, and M34, although stage 230 can include any of various number of transistors without departing from the scope of the disclosure. In some embodiments, the stage 230 is similar (e.g., the number of and arrangement of the transistors) to the stage 210. For example, M31, M32, M33, and M34 are arranged in a similar way to M11, M12, M13, and M14, respectively.

In some embodiments, in response to receiving a first signal from line 218, M31 electrically couples line 232 to line 234. In some embodiments, in response to receiving a second signal from line 218, M31 electrically decouples line 232 from line 234. In some embodiments, in response to receiving a first signal from line 222, M32 electrically couples line 232 to line 234. In some embodiments, in response to receiving a second signal from line 222, M32 electrically decouples line 232 from line 234.

In some embodiments, in response to receiving a first signal from line 232, M33 electrically couples line 222 to line 234. In some embodiments, in response to receiving a second signal from line 232, M33 electrically decouples line 222 from line 234. In some embodiments, in response to receiving a first signal from line 232, M34 electrically couples line 218 to line 234. In some embodiments, in response to receiving a second signal from line 232, M34 electrically decouples line 218 from line 234.

In some embodiments, the stage 240 includes transistors M41, M42, M43, and M44, although stage 240 can include any of various number of transistors without departing from the scope of the disclosure. The transistors M41 and M42 can be a complementary transmission gate and the transistors M43 and M44 can be a second complementary transmission gate. Each of the transistor pairs M41/M42 and M43/M44 can be similar to the complementary transmission gate M11/M12.

In some embodiments, in response to receiving a first signal from line 222, M41 electrically couples line 232 to line 242. In some embodiments, in response to receiving a second signal from line 222, M41 electrically decouples line 232 from line 242. In some embodiments, in response to receiving a first signal from line 218, M42 electrically couples line 232 to line 242. In some embodiments, in response to receiving a second signal from line 218, M42 electrically decouples line 232 from line 242.

In some embodiments, in response to receiving a first signal from line 218, M43 electrically couples line 212 to line 242. In some embodiments, in response to receiving a second signal from line 218, M43 electrically decouples line 212 from line 242. In some embodiments, in response to receiving a first signal from line 222, M44 electrically couples line 212 to line 242. In some embodiments, in response to receiving a second signal from line 222, M44 electrically decouples line 212 from line 242.

Figure 4A:
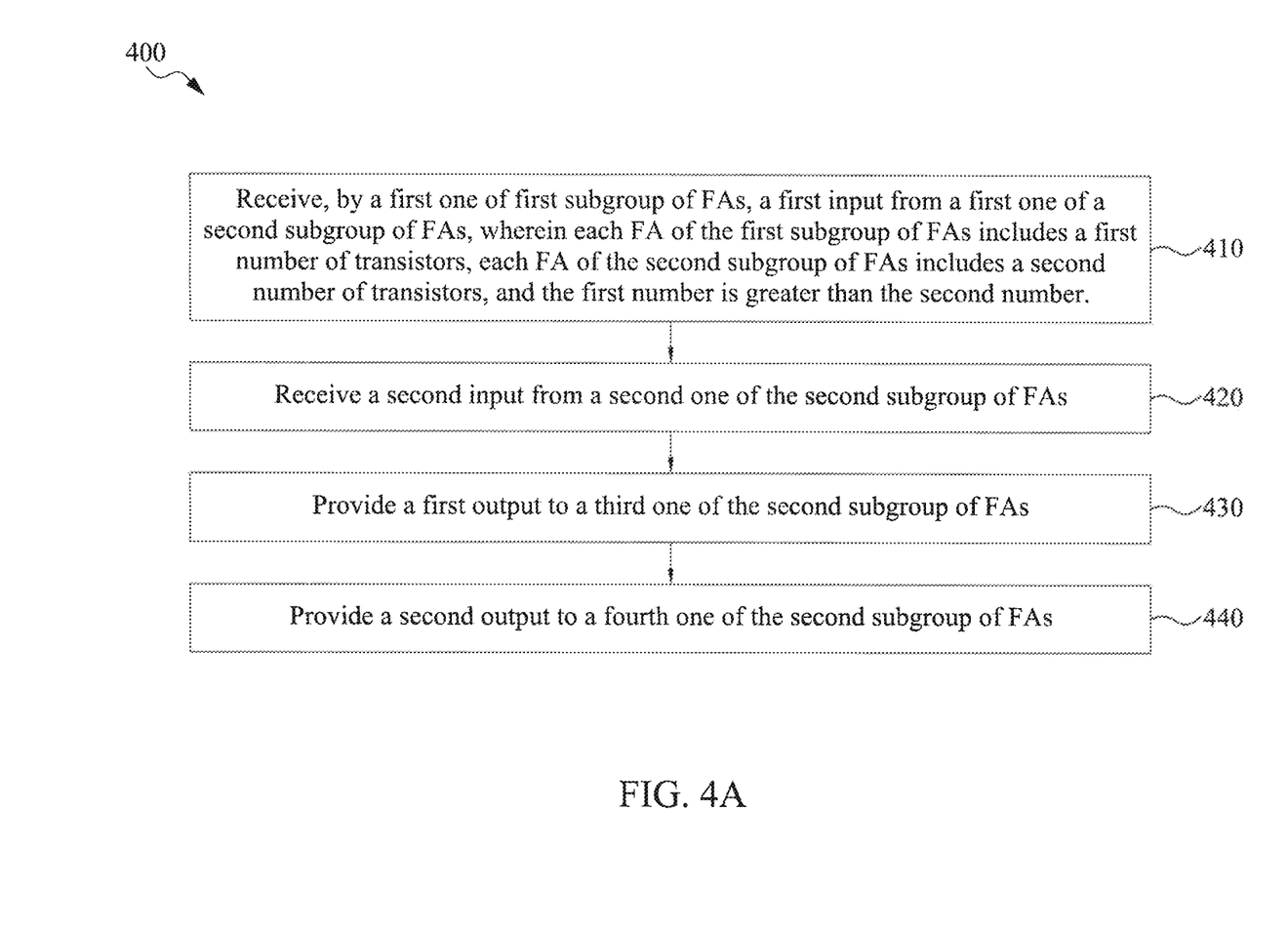
FIG. 4A illustrates a flowchart of a method to operate an adder tree, in accordance with some embodiments of the present disclosure.

FIG. 4A illustrates a flowchart of a method 400 to operate an adder tree, in accordance with some embodiments of the present disclosure. It is noted that the method 400 is merely an example and is not intended to limit the present disclosure. Accordingly, it is understood that additional operations may be provided before, during, and after the method 400 of FIG. 4A, and that some other operations may only be briefly described herein. In some embodiments, the method 400 is performed by a full adder, such as any full adder of FIGS. 1A-3, including the full adder 115B of FIG. 1A, the full adder 200 of FIG. 2, etc.

The method 400 starts with operation 410 of receiving, by a first one (e.g., 115B of FIG. 1A) of a first subgroup of FAs (e.g., 105A, 105C, 110A, 110C, 115B, 115D, 120A, and 120C of FIG. 1A), a first input (e.g., through the line 115B1 of FIG. 1A) from a first one (e.g., 115A of FIG. 1A) of a second subgroup of FAs (e.g., 105B, 105D, 110B, 110D, 115A, 115C, 120B, and 120D of FIG. 1A). In some embodiments, each FA of the first subgroup of FAs includes a first number of transistors (e.g., 28 transistors), each FA of the second subgroup of FAs includes a second number of transistors (e.g., 14 transistors including M11-M14, M21-M22, M31-M34, and M41-M44 of FIG. 3), and the first number is greater than the second number. The method 400 continues to operation 420 of receiving a second input (e.g., through the line 115B2 of FIG. 1A) from a second one (e.g., 105B of FIG. 1A) of the second subgroup of FAs. The method 400 continues to operation 430 of providing a first output (e.g., through the line 115B4 of FIG. 1A) to a third one (e.g., 115C of FIG. 1A) of the second subgroup of FAs. The method 400 continues to operation 440 of providing a second output (e.g., through the line 115B5 of FIG. 1A) to a fourth one (e.g., 120B of FIG. 1A) of the second subgroup of FAs.

In some embodiments, the first input is a first operand (e.g., a first sum generated by the first one of the second subgroup of FAs), the second input is a first carry-out generated by the second one of the second subgroup of FAs, the first output is a second sum generated by the first one of the first subgroup of FAs, and the second output is a second carry-out generated by the first one of the first subgroup of FAs. In some embodiments, the first input is received through an A port of the first one of the first subgroup of FAs and the second input is received through a carry-in port of the first one of the first subgroup of FAs, the first output is provided through a sum port of the first one of the first subgroup of FAs and the second output is provided through a carry-out port of the first one of the first subgroup of FAs.

Figure 4B:
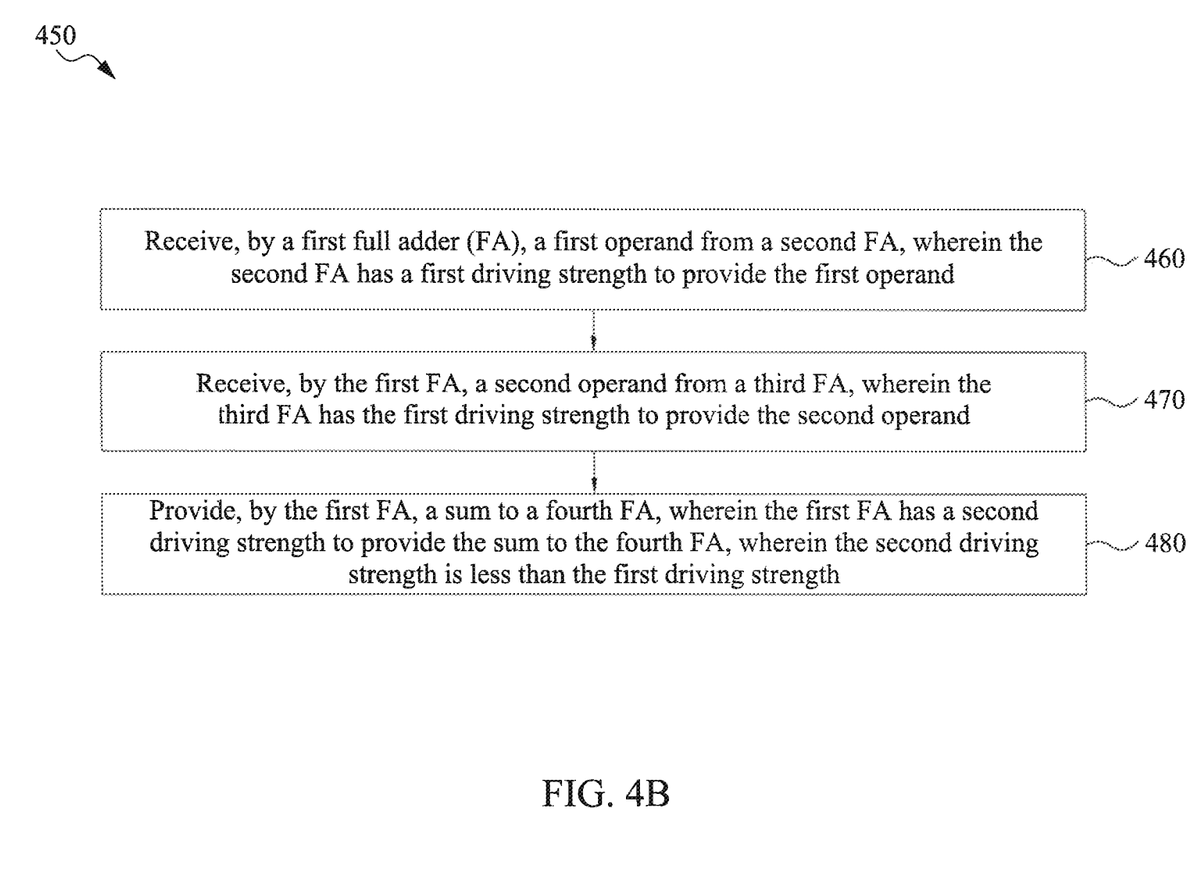
FIG. 4B illustrates a flowchart of another method to operate an adder tree, in accordance with some embodiments of the present disclosure.

FIG. 4B illustrates a flowchart of a method 450 to operate an adder tree, in accordance with some embodiments of the present disclosure. It is noted that the method 450 is merely an example and is not intended to limit the present disclosure. Accordingly, it is understood that additional operations may be provided before, during, and after the method 450 of FIG. 4B, and that some other operations may only be briefly described herein. In some embodiments, the method 450 is performed by a full adder, such as any full adder of FIGS. 1A-3, including the full adder 115B of FIG. 1A, the full adder 200 of FIG. 2, etc.

The method 450 starts with operation 460 of receiving, by a first full adder (FA) (e.g., 115B of FIG. 1A), a first operand (e.g., through the line 115B2 of FIG. 1A) from a second FA (e.g., 105B of FIG. 1A), wherein the second FA has a first driving strength to provide the first operand to the first FA. The first driving strength may be embodied, modeled, or otherwise represented, by a first output conductance of the second FA. The first driving strength can determine, or otherwise influence, a first speed of charging the first FA to a voltage level equal to a magnitude of the first operand.

The method 450 continues to operation 470 of receiving, by the first FA, a second operand (e.g., through the line 115B3 of FIG. 1A) from a third FA (e.g., 110B of FIG. 1A), wherein the third FA has the first driving strength to provide the second operand to the first FA. In some embodiments, the method includes receiving, by the first FA, a carry-in (e.g., through the line 115B1 of FIG. 1A) from a fourth FA (e.g., 115A of FIG. 1A), wherein the fourth FA has the first driving strength to provide the carry-in to the first FA. In some embodiments, the method includes generating, at least based on the first operand and the second operand, a sum. In some embodiments, the method includes generating, by the first FA, at least based on the first operand, the second operand, and the carry-in, the sum. In some embodiments, generating includes performing at least one exclusive-OR (XOR) operation and one multiplexing operation. Details of operations for generating the sum are further described with respect to FIGS. 2-3.

The method 450 continues to operation 480 of providing, by the first FA, the sum (e.g., through the line 115B5 of FIG. 1A) to a fifth FA (e.g., 120B of FIG. 1A), wherein the first FA has a second driving strength to provide the sum to the fifth FA. In some embodiments, the second driving strength is less than the first driving strength. In other embodiments, the second driving strength is greater than the first driving strength. The second driving strength may be embodied, modeled, or otherwise represented, by a second output conductance of the first FA. The second driving strength can determine a second speed of charging the fifth FA to a voltage level equal to a magnitude of the sum. In some embodiments, the second conductance is less than the first conductance. In other embodiments, the second conductance is greater than the first conductance. In some embodiments, the second speed is less than the first speed. In other embodiments, the second speed is greater than the first speed.

In some embodiments, the method includes generating, by the first FA, at least based on the first operand and the second operand, a carry-out. In some embodiments, the method includes generating, by the first FA, at least based on the first operand, the second operand, and the carry-in, the carry-out. In some embodiments, the method includes providing, by the first FA, the carry-out (e.g., through the line 115B4 of FIG. 1A) to a sixth FA (e.g., 115C of FIG. 1A), wherein the first FA has the second driving strength to provide the carry-out to the sixth FA.

Figure 5:
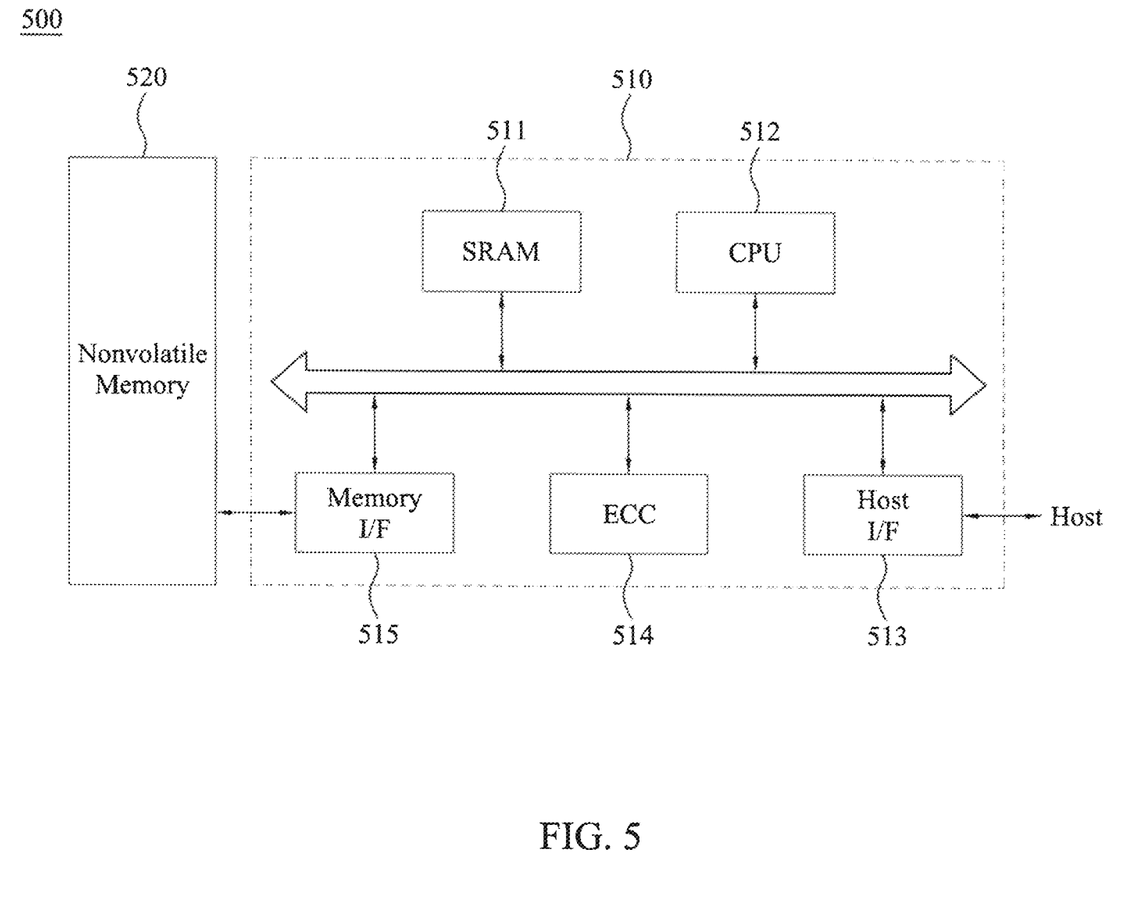
FIG. 5 is a block diagram showing the configuration of a memory system, according to various embodiment of the present disclosure.

FIG. 5 is a block diagram showing the configuration of a memory system 500, according to various embodiment of the present disclosure. As shown, a memory system 500 according to various embodiments of the present disclosure includes a non-volatile memory device 520 and a memory controller 510. In some embodiments, one or more blocks/components of the memory system 500 includes an adder tree such as the adder tree 100A.

The non-volatile memory device 520 may include the 3D memory device, as disclosed herein. In addition, the non-volatile memory device 520 may be a multi-chip package composed of a number of ferroelectric memory chips.

The memory controller 510 is configured to control the non-volatile memory device 520. The memory controller 510 may include RAM 511, a central processing unit (CPU) 512, a host interface (I/F) 513, an error-correcting code (ECC) 514, and a memory interface 515. The RAM 511 functions as an operation memory of the CPU 512. The RAM 511 may include the memory array 102 described herein. The CPU 512 performs the general control operation for data exchange of the memory controller 510. The host interface 513 includes a data exchange protocol of a host being coupled to the memory system 500. In addition, the ECC 514 may detect and correct errors included in a data read from the non-volatile memory device 520. The memory interface 515 interfaces with the non-volatile memory device 520. The memory controller 510 may further store code data to interface with the host.

In some aspects of the present disclosure, an adder tree circuit is disclosed. In some aspects, the adder tree circuit includes a plurality of full adders (FAs) including: a first subgroup of FAs, wherein each FA of the first subgroup includes a first number of transistors; and a second subgroup of FAs, wherein each FA of the second subgroup includes a second number of transistors, the first number being greater than the second number; wherein each FA of the first subgroup receives a first input from a first one of the second subgroup of FAs and a second input from a second one of the second subgroup of FAs, and each FA provides a first output to a third one of the second subgroup of FAs and a second output to a fourth one of the second subgroup of FAs.

In some aspects, the first input is an operand received from the first one of the second subgroup of FAs, the second input is a first carry-out received from the second one of the second subgroup of FAs, the first output is a sum provided to the third one of the second subgroup of FAs, and the second output is a second carry-out provided to the fourth one of the second subgroup of FAs.

In some aspects, each FA of the second subgroup receives a third input from a first one of the first subgroup of FAs and a fourth input from a second one of the first subgroup of FAs, and each FA provides a third output to a third one of the first subgroup of FAs and a fourth output to a fourth one of the first subgroup of FAs. In some aspects, each FA of the second subgroup receives a third input from a fifth one of the second subgroup of FAs and provides a third output to a sixth one of the second subgroup of FAs.

In some aspects, the plurality of FAs includes a plurality of multi-bit FAs, wherein each multi-bit FA includes at least one of the first subgroup of FAs and at least one of the second subgroup of FAs. In some aspects, each multi-bit FA receives a third input from a first multi-bit FA and provides a third output to a second multi-bit FA. In some aspects, each multi-bit FA includes a third number of FAs, wherein the first multi-bit FA includes a fourth number of FAs, and wherein the second multi-bit FA includes a fifth number of FAs, the third number being one greater than the fourth number, and the fifth number being one greater than the third number.

In some aspects, each FA of the first subgroup has 28 transistors and each FA of the second subgroup has 14 transistors. In some aspects, each FA of the first subgroup has 28 transistors and each FA of the second subgroup has 10 transistors. In some aspects, each FA of the first subgroup has 28 transistors and each FA of the second subgroup has 20 transistors. In some aspects, each FA of the first subgroup has 28 transistors and each FA of the second subgroup has 16 transistors.

In some aspects of the present disclosure, an adder circuit is disclosed. In some aspects, the adder circuit includes a first stage configured to: receive a first input signal and a second input signal; and provide a first output signal; a second stage coupled to the first stage and configured to invert the first output signal to provide a second output signal; a third stage coupled to the first stage and the second stage and configured to: receive a carry-in signal, the first output signal, and the second output signal; and provide a sum signal; and a fourth stage coupled to the first stage and the second stage and configured to: receive the carry-in signal, the first input signal, the first output signal, and the second output signal; and provide a carry-out signal.

In some aspects, the first stage, the second stage, the third stage, and the fourth stage collectively include 14 transistors. In some aspects, the first stage performs an exclusive-OR (XOR) operation on the first input signal and the second input signal. In some aspects, the third stage performs an XOR operation on the carry-in signal and the first output signal. In some aspects, the fourth stage multiplexes between the first input signal and the carry-in signal based on the first output signal.

In some aspects, the first stage receives a third input signal that is an inverted instance of the second input signal. In some aspects, the first stage includes one transmission gate and a complementary pair of transistors having their gates shorted to each other.

In some aspects, a method of operating a full adder includes receiving, by a first full adder (FA), a first operand from a second FA, wherein the second FA has a first driving strength to provide the first operand to the first FA; receiving, by the first FA, a second operand from a third FA, wherein the third FA has the first driving strength to provide the second operand to the first FA; and providing, by the first FA, a sum to a fourth FA, wherein the first FA has a second driving strength to provide the sum to the fourth FA, wherein the second driving strength is less than the first driving strength. In some embodiments, the method includes receiving, by a fifth FA, a carry-in, wherein the fifth FA has the first driving strength to provide the carry-in.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An adder tree circuit comprising:
    a plurality of full adders (FAs) comprising:
        a first subgroup of FAs, wherein each FA of the first subgroup includes a first number of transistors; and
        a second subgroup of FAs, wherein each FA of the second subgroup includes a second number of transistors, the first number being greater than the second number;
    wherein each FA of the first subgroup receives a first input from a first one of the second subgroup of FAs and a second input from a second one of the second subgroup of FAs, and each FA provides a first output to a third one of the second subgroup of FAs and a second output to a fourth one of the second subgroup of FAs.

2. The adder tree circuit of claim 1, wherein the first input is an operand received from the first one of the second subgroup of FAs, the second input is a first carry-out received from the second one of the second subgroup of FAs, the first output is a sum provided to the third one of the second subgroup of FAs, and the second output is a second carry-out provided to the fourth one of the second subgroup of FAs.

3. The adder tree circuit of claim 1, wherein each FA of the second subgroup receives a third input from a first one of the first subgroup of FAs and a fourth input from a second one of the first subgroup of FAs, and each FA provides a third output to a third one of the first subgroup of FAs and a fourth output to a fourth one of the first subgroup of FAs.

4. The adder tree circuit of claim 1, wherein each FA of the second subgroup receives a third input from a fifth one of the second subgroup of FAs and provides a third output to a sixth one of the second subgroup of FAs.

5. The adder tree circuit of claim 1, wherein the plurality of FAs includes a plurality of multi-bit FAs, wherein each multi-bit FA includes at least one of the first subgroup of FAs and at least one of the second subgroup of FAs.

6. The adder tree circuit of claim 5, wherein each multi-bit FA receives a third input from a first multi-bit FA and provides a third output to a second multi-bit FA.

7. The adder tree circuit of claim 6, wherein each multi-bit FA includes a third number of FAs, wherein the first multi-bit FA includes a fourth number of FAs, and wherein the second multi-bit FA includes a fifth number of FAs, the third number being one greater than the fourth number, and the fifth number being one greater than the third number.

8. The adder tree circuit of claim 1, wherein each FA of the first subgroup has 28 transistors and each FA of the second subgroup has 14 transistors.

9. The adder tree circuit of claim 1, wherein each FA of the first subgroup has 28 transistors and each FA of the second subgroup has 10 transistors.

10. The adder tree circuit of claim 1, wherein each FA of the first subgroup has 28 transistors and each FA of the second subgroup has 20 transistors.

11. The adder tree circuit of claim 1, wherein each FA of the first subgroup has 28 transistors and each FA of the second subgroup has 16 transistors.

12. A method of operating a full adder comprising:
    receiving, by a first full adder (FA), a first operand from a second FA, wherein the second FA has a first driving strength to provide the first operand to the first FA;
    receiving, by the first FA, a second operand from a third FA, wherein the third FA has the first driving strength to provide the second operand to the first FA; and
    providing, by the first FA, a sum to a fourth FA, wherein the first FA has a second driving strength to provide the sum to the fourth FA, wherein the second driving strength is less than the first driving strength.

13. The method of claim 12, further comprising receiving, by a fifth FA, a carry-in, wherein the fifth FA has the first driving strength to provide the carry-in.

14. An adder tree circuit comprising:
    a plurality of full adders (FAs) comprising:
        a first subgroup of FAs, wherein each FA of the first subgroup includes a first number of transistors; and
        a second subgroup of FAs, wherein each FA of the second subgroup includes a second number of transistors;
    wherein the first number is greater than the second number, wherein the plurality of FAs includes a plurality of multi-bit FAs, wherein each multi-bit FA includes at least one of the first subgroup of FAs and at least one of the second subgroup of FAs.

15. The adder tree circuit of claim 14, wherein each FA of the first subgroup receives a first input from a first one of the second subgroup of FAs and a second input from a second one of the second subgroup of FAs, and each FA provides a first output to a third one of the second subgroup of FAs and a second output to a fourth one of the second subgroup of FAs.

16. The adder tree circuit of claim 15, wherein the first input is an operand received from the first one of the second subgroup of FAs, the second input is a first carry-out received from the second one of the second subgroup of FAs, the first output is a sum provided to the third one of the second subgroup of FAs, and the second output is a second carry-out provided to the fourth one of the second subgroup of FAs.

17. The adder tree circuit of claim 15, wherein each FA of the second subgroup receives a third input from a first one of the first subgroup of FAs and a fourth input from a second one of the first subgroup of FAs, and each FA provides a third output to a third one of the first subgroup of FAs and a fourth output to a fourth one of the first subgroup of FAs.

18. The adder tree circuit of claim 14, wherein the first number is equal to 28, and the second number is equal to 10, 14, 16, or 20.

19. The adder tree circuit of claim 14, wherein the first number is equal to 28, and the second number is equal to or less than 20.

20. The adder tree circuit of claim 14, wherein each multi-bit FA receives a third input from a first multi-bit FA and provides a third output to a second multi-bit FA.

* * * * *